(12) United States Patent
Hawker et al.

(10) Patent No.: US 6,413,587 B1
(45) Date of Patent: Jul. 2, 2002

(54) METHOD FOR FORMING POLYMER BRUSH PATTERN ON A SUBSTRATE SURFACE

(75) Inventors: Craig Jon Hawker, Los Gatos; James Lupton Hedrick, Pleasanton, both of CA (US); Nicholas Abbott, Madison, WI (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/261,300

(22) Filed: Mar. 2, 1999

(51) Int. Cl.[7] .............................. B05D 1/28; B05D 1/36
(52) U.S. Cl. ...................... 427/264; 427/265; 427/266; 427/270; 427/275; 427/287
(58) Field of Search ................................ 427/264, 265, 427/261, 270, 275, 266, 287

(56) References Cited

U.S. PATENT DOCUMENTS

| | | | |
|---|---|---|---|
| 5,512,131 A | 4/1996 | Kumar et al. | 156/655.1 |
| 5,620,850 A * | 4/1997 | Bamdad et al. | 530/300 |
| 5,869,135 A * | 2/1999 | Vaeth et al. | 427/255 |

OTHER PUBLICATIONS

Hawley's Condensed Chemical Dictionary, 12th ed., p. 942, 1993.*

Delmarche et al. (1998), "Transport Mechanisms of Alkanethiols During Microcontact Printing on Gold," *J. Phys. Chem. B.* 102:3324.

Jackman et al. (1995), "Fabrication of Submicrometer Features on Curved Substrates by Microcontact Printing," *Science* 269:664–666.

Kumar et al. (1992), "The Use of Self–Assembled Monolayers and a Selective Etch to Generate Patterned Gold Features," *J. Am. Chem. Soc.* 114:9188–9189.

Kumar et al. (1994), "Patterning Self–Assembled Monolayers: Applications in Materials Science," *La3ngmuir* 10(5):1498–1511.

Xia et al. (1998), "Soft Lithography," *Angew. Chem. Int. Ed.* 37:550–575.

\* cited by examiner

*Primary Examiner*—Shrive P. Beck
*Assistant Examiner*—Kirsten A. Crockford
(74) *Attorney, Agent, or Firm*—Reed & Associates

(57) ABSTRACT

A method is disclosed for providing a patterned surface wherein predetermined regions of the surface are masked with a self-assembled monolayer ("SAM") covalently bound to a brush polymer overlayer. The remainder of the substrate surface will generally be functionalized with a second self-assembled monolayer. Preferably, the method involves a microcontact printing technique, wherein a molecular moiety capable of spontaneously forming an SAM upon transfer to a surface is "stamped" onto a substrate surface, followed by growth (or covalent attachment) of a polymer on exposed functional groups within the SAM molecules. Coverage of surface regions with both an SAM and a polymer overlayer provides a number of advantages, particularly with regard to surface masking during etching and the like. The method is useful in the manufacture of microelectronic circuitry, biosensors, high-density assay plates, and the like.

27 Claims, 3 Drawing Sheets

METHOD FOR FORMING POLYMER BRUSH PATTERN ON A SUBSTRATE SURFACE

TECHNICAL FIELD

This invention relates generally to the chemical modification of substrate surfaces so as to provide a pattern thereon, and more particularly relates to the formation of a patterned surface using a microcontact printing technique followed by surface-initiated synthesis of polymer brushes within the framework of the pattern.

BACKGROUND

The generation of complex patterns in polymer films is traditionally achieved by combining spin-casting and photolithographic techniques. Polymer films patterned by this procedure are widely used for the fabrication of microelectronic devices or as selective barriers to etchants and redox-active probes. While successful, the utility of these patterned polymer films is restricted by their limited stability to solvents and subsequent chemical reaction, and difficulties in their preparation over large areas and complicated topographies. To address these latter challenges, Whitesides and coworkers have introduced the concept of microcontact printing ($\mu$CP) for the preparation of patterned self-assembled monolayers (or "SAMs") on both planar and curved surfaces; see, e.g., Jackman et al. (1995) *Science* 269:994. This "soft lithography" technique involves transfer of a molecular moiety from an elastomeric stamp to a substrate surface. The molecular moiety is such that self-assembled monolayers spontaneously form upon transfer from the stamp to a substrate. As is known in the art, self-assembled monolayers result from the chemisorption and self-organization of functionalized, long-chain organic molecules.

Self-assembled monolayers formed from alkanethiols on gold and silver have been studied extensively and proposed for use as barriers to wet chemical etchants (Kumar et al. (1994) *Langmuir* 10: 1498; Xia et al. (1998) *Angew. Chem. Int. Ed.* 37:550). In this approach, however, the utility of self-assembled monolayers as barriers to etchants is compromised by the susceptibility of monolayer films to formation of defects (Kumar et al. (1992) *J. Am. Chem. Soc.* 114:9188), their lack of barrier properties when using dry etchants such as reactive ions, and the conflicting time scales necessary for complete formation of SAMs and for high resolution patterning (Delamarche et al. (1998) *J. Phys. Chem. B.* 102:3324).

This invention is addressed to the above-mentioned limitations in the art, and provides a new method of using soft lithography to manufacture patterned surfaces, wherein polymerization is employed as a tool to chemically amplify surfaces already patterned with SAMs and thus provide a macromolecular barrier to etchants and the like. The preparation of a macromolecular barrier instead of a molecular one provides a means to mask defects within self-assembled monolayers and introduce resistance to a wide range of etchants. In addition, high resolution patterning is achieved by using surface-initiated polymerization to mask incomplete regions of SAMs and minimize lateral transport of the molecular moieties contained therein.

SUMMARY OF THE INVENTION

Accordingly, it is a primary object of the invention to address the above-mentioned need in the art by providing a method for preparing a substrate having a patterned surface, wherein the pattern is comprised of a self-assembled monolayer of molecular segments having an overlying polymer "brush" layer covalently bound thereto.

It is another object of the invention to provide such a method which involves formation of a first self-assembled monolayer within predetermined regions of a substrate surface and subsequent deposition of a second self-assembled monolayer on the remainder of the substrate surface, followed by surface-initiated polymerization to provide a brush polymer pattern using functional groups present within the second self-assembled monolayer as polymerization initiation sites.

It is still another object of the invention to provide such a method wherein the first self-assembled monolayer is comprised of an inert molecular segment that is transferred to the substrate surface from a patterned stamp using a microcontact printing technique.

It is yet another object of the invention to provide a method for preparing a substrate having a patterned surface comprised of a self-assembled monolayer of molecular segments having an overlying polymer "brush" layer covalently bound thereto, wherein the method involves formation of a first self-assembled monolayer within predetermined regions of a substrate surface and optional deposition of a second self-assembled monolayer on the remainder of the substrate surface, followed by surface-initiated polymerization to provide a brush polymer pattern using functional groups present within the first self-assembled monolayer as polymerization initiation sites.

It is a further object of the invention to provide a method for etching a conductive substrate surface by preparing a self-assembled monolayer on the substrate surface in the form of a pattern, leaving the remainder of the substrate surface exposed, conducting surface-initiated polymerization to provide a brush polymer pattern using functional groups present within the self-assembled monolayer as polymerization initiation sites, and etching the exposed surface with a chemical etchant.

It is still a further object of the invention to provide such a method which further comprises removing the organic material from the substrate surface after etching.

Yet another object of the invention is to provide surface-modified substrates having a patterned surface comprised of a self-assembled monolayer of molecular segments having an overlying polymer brush layer covalently bound thereto.

Additional objects, advantages and novel features of the invention will be set forth in part in the description which follows, and in part will become apparent to those skilled in the art upon examination of the following, or may be learned by practice of the invention.

In a first embodiment of the invention, then, a method is provided for preparing a substrate having a patterned surface, comprising:

(a) providing a substrate having a surface to which molecular moieties can covalently bind;

(b) identifying predetermined regions on the substrate surface that correspond to a desired surface pattern;

(c) derivatizing the substrate surface by contacting the predetermined regions of the surface with a molecular moiety A-B, wherein A is a reactive terminus and B is an inert segment, under conditions effective to bring about covalent binding of the molecular moiety A-B to the surface through the reactive terminus A, thus providing surface-bound B segments in the predetermined regions with the remainder of the surface comprised of unmodified regions;

(d) contacting the derivatized substrate surface provided in step (c) with a molecular moiety A'-L-C, wherein A' is a reactive terminus and may or may not be the same as A, L is a linker, and C is a molecular segment terminating in a functional group, under conditions effective to bring about covalent binding of the molecular moiety A'-L-C to the unmodified regions of the substrate surface through the reactive terminus A', whereby a modified substrate surface is provided having surface-bound B segments in the predetermined regions and surface-bound C segments on the remainder of the surface; and (e) contacting the modified surface provided in step (d) with a polymerizable composition under conditions effective to result in the synthesis or covalent attachment of a polymer to the functional groups of the surface-bound C segments.

In an alternative embodiment of the invention, a method is provided for preparing a substrate having a patterned surface, comprising:

(a) providing a substrate having a surface to which molecular moieties can covalently bind;

(b) identifying predetermined regions on the substrate surface that correspond to a desired surface pattern;

(c) derivatizing the substrate surface by contacting the predetermined regions of the surface with a molecular moiety A'-L-C, wherein A' is a reactive terminus, L is a linker, and C is a molecular segment terminating in a functional group, under conditions effective to bring about covalent binding of the molecular moiety A'-L-C to the surface through the reactive terminus A', thus providing surface-bound -L-C segments in the predetermined regions, with the remainder of the surface comprised of underivatized regions;

(d) optionally modifying the underivatized regions by contacting those regions with a molecular moiety A-B, wherein A is a reactive terminus and may or may not be the same as A' and B is an inert segment, under conditions effective to bring about covalent binding of the molecular moiety A-B to the surface through the reactive terminus A, thus providing surface-bound B segments in the underivatized regions; and (e) contacting the provided in step (c) or step (d) with a polymerizable composition under conditions effective to result in the synthesis or covalent attachment of a polymer to the functional groups of the surface-bound C segments.

In another embodiment of the invention, a method is provided for etching an electrically conductive substrate surface, comprising:

(a) providing a substrate having an electrically conductive surface;

(b) identifying predetermined regions on the electrically conductive surface to be protected from etching;

(c) contacting the predetermined regions with a molecular moiety A'-L-C, wherein A' is a reactive terminus, L is a linker, and C is a molecular segment terminating in a functional group, under conditions effective to bring about covalent binding of the molecular moiety A'-L-C to the surface through the reactive terminus A', thus providing surface-bound -L-C segments in the predetermined regions with the remainder of the surface comprised of unmodified, exposed regions; and (d) contacting the surface derivatized in step (c) with a polymerizable composition under conditions effective to result in the synthesis or covalent attachment of a polymer to the functional groups of the surface-bound C segments; and (e) contacting the surface modified in step (d) with a reagent that is selected to degrade the unmodified, exposed regions of the electrically conductive surface but that is inert with respect to the surface-bound polymer.

Preferably, following step (e), the method further includes removing the surface-bound -L-C groups and the polymer to uncover the predetermined regions of the electrically conductive surface.

In a further embodiment of the invention, substrates having modified, patterned surfaces are provided that can be prepared using the methods described and claimed herein. The patterned substrates may be microelectronic devices, or they be biosensors, high-density bioassay plates, or the like. The preferred use of the invention is in the fabrication of microcircuitry such as microelectronic resistors, transistors, capacitors and circuit breakers.

DETAILED DESCRIPTION OF THE INVENTION

Figure 1:
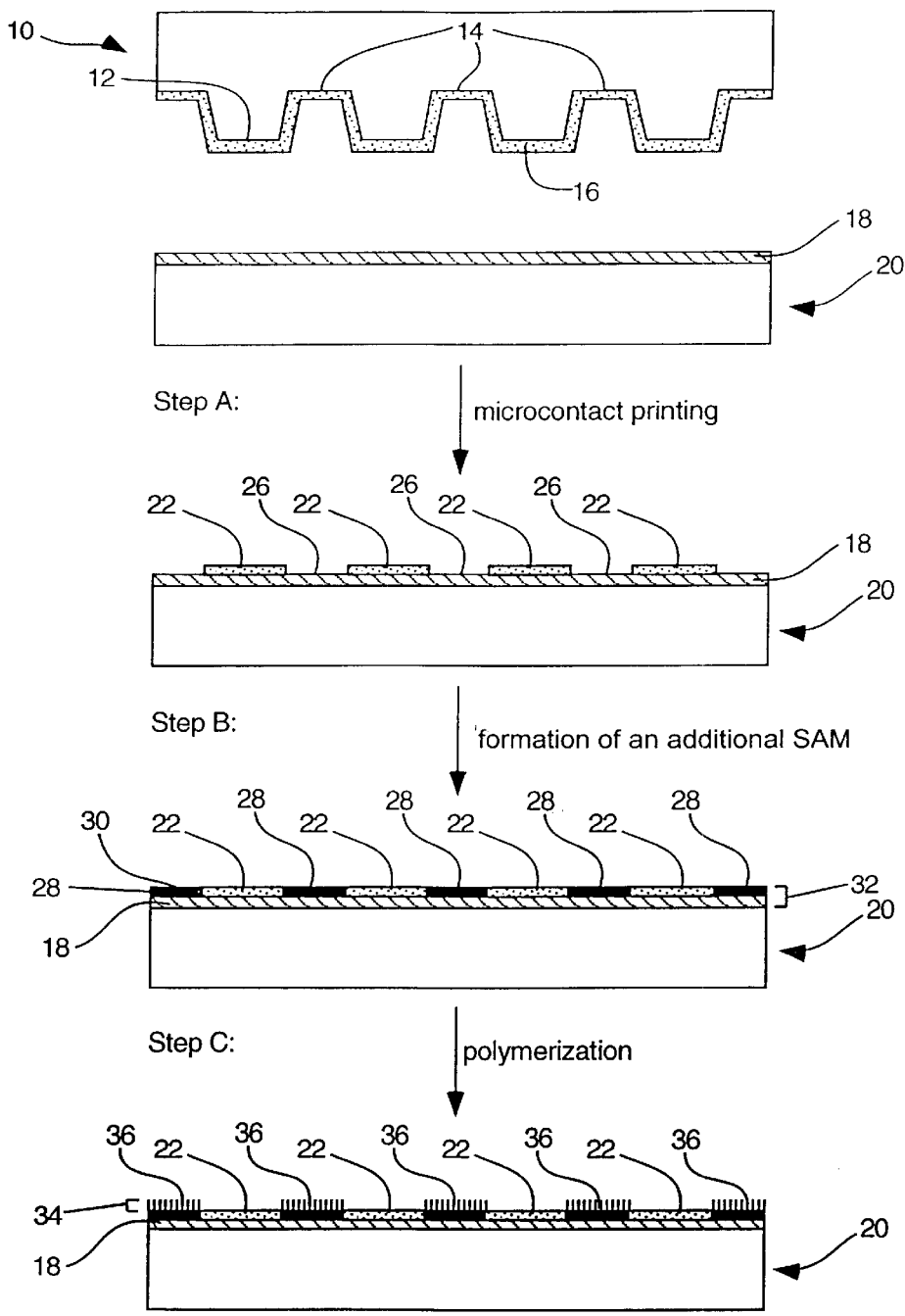
FIG. 1 illustrates preparation of a brush polymer pattern on a substrate surface using the method of the invention.

OVERVIEW AND DEFINITIONS:

Before describing the present invention in detail, it is to be understood that this invention is not limited to specific compositions, components or process steps, as such may vary. It is also to be understood that the terminology used herein is for the purpose of describing particular embodiments only, and is not intended to be limiting.

It must be noted that, as used in this specification and the appended claims, the singular forms "a," "and," and "the" include plural referents unless the context clearly dictates otherwise. Thus, for example, reference to "a polymer" includes more than one polymer, reference to "a substituent" includes more than one substituent, reference to "a layer" includes multiple layers, and the like.

In describing and claiming the present invention, the following terminology will be used in accordance with the definitions set out below.

The term "polymer" is used to refer to a chemical compound that comprises linked monomers, and that may or may not be linear; in the context of the present invention, the "polymers" are, however, generally linear. Polymer "segments" refer to a polymer that is covalently bound to two additional moieties, generally end-capping moieties at each of two termini.

The term "alkyl" as used herein refers to a branched or unbranched saturated hydrocarbon group generally comprising 1 to 24 carbon atoms, such as methyl, ethyl, n-propyl, isopropyl, n-butyl, isobutyl, t-butyl, octyl, decyl, tetradecyl, hexadecyl, eicosyl, tetracosyl and the like, as well as cycloalkyl groups such as cyclopentyl, cyclohexyl and the like. The term "lower alkyl" intends an alkyl group of one to six carbon atoms, preferably one to four carbon atoms.

The term "alkenyl" as used herein refers to a branched or unbranched hydrocarbon group generally comprising 2 to 24 carbon atoms and containing at least one double bond, typically containing one to six double bonds, more typically one or two double bonds, e.g., ethenyl, n-propenyl, n-butenyl, octenyl, decenyl, and the like, as well as cycloalkenyl groups such as cyclopentenyl, cyclohexenyl and the like. The term "lower alkenyl" intends an alkenyl group of two to six carbon atoms, preferably two to four carbon atoms.

The term "alkylene" as used herein refers to a difunctional branched or unbranched saturated hydrocarbon group generally comprising 1 to 24 carbon atoms, such as methylene, ethylene, n-propylene, n-butylene, n-hexylene, decylene, tetradecylene, hexadecylene, and the like. The term "lower alkylene" refers to an alkylene group of one to six carbon atoms, preferably one to four carbon atoms.

The term "alkenylene" as used herein refers to a difunctional branched or unbranched hydrocarbon group generally comprising 2 to 24 carbon atoms and containing at least one double bond, such as ethenylene, n-propenylene, n-butenylene, n-hexenylene, and the like. The term "lower alkenylene" refers to an alkylene group of two to six carbon atoms, preferably two to four carbon atoms.

The term "alkoxy" as used herein refers to a substituent -O-R wherein R is alkyl as defined above. The term "lower alkoxy" refers to such a group wherein R is lower alkyl.

The term "aryl" as used herein, and unless otherwise specified, refers to an aromatic moiety containing one to five aromatic rings. For aryl groups containing more than one aromatic ring, the rings may be fused or linked. Aryl groups are optionally substituted with one or more inert, nonhydrogen substituents per ring; suitable "inert, nonhydrogen" substituents include, for example, halo, haloalkyl (preferably halo-substituted lower alkyl), alkyl (preferably lower alkyl), alkenyl (preferably lower alkenyl), alkynyl (preferably lower alkynyl), alkoxy (preferably lower alkoxy), alkoxycarbonyl (preferably lower alkoxycarbonyl), carboxy, nitro, cyano and sulfonyl. Unless otherwise indicated, the term "aryl" is also intended to include heteroaromatic moieties, i.e., aromatic heterocycles. Generally the heteroatoms will be nitrogen, oxygen or sulfur.

The term "arylene" as used herein, and unless otherwise specified, refers to a bifunctional aromatic moiety containing one to five aromatic rings. Arylene groups are optionally substituted with one or more substituents per ring as set forth above for substitution of an "aryl" moiety.

The term "halo" is used in its conventional sense to refer to a chloro, bromo, fluoro or iodo substituent. In the compounds described and claimed herein, halo substituents are generally bromo, chloro or iodo, preferably bromo or chloro. The terms "haloalkyl," "haloaryl" (or "halogenated alkyl" or "halogenated aryl") refer to an alkyl or aryl group, respectively, in which at least one of the hydrogen atoms in the group has been replaced with a halogen atom.

The term "heterocyclic" refers to a five- or six-membered monocyclic structure or to an eight- to eleven-membered bicyclic heterocycle. The "heterocyclic" substituents herein may or may not be aromatic, i.e., they may be either heteroaryl or heterocycloalkyl. Each heterocycle consists of carbon atoms and from one to three, typically one or two, heteroatoms selected from the group consisting of nitrogen, oxygen and sulfur, typically nitrogen and/or oxygen. The term "nonheterocyclic" as used herein refers to a compound that is not heterocyclic as just defined.

The term "hydrocarbyl" is used in its conventional sense to refer to a hydrocarbon group containing carbon and hydrogen, and may be aliphatic, alicyclic or aromatic, or may contain a combination of aliphatic, alicyclic and/or aromatic moieties. Aliphatic and alicyclic hydrocarbyl may be saturated or they may contain one or more unsaturated bonds, typically double bonds. The hydrocarbyl substituents herein generally contain 1 to 20 carbon atoms, and may be substituted with various substituents and functional groups.

The term "hydrocarbylene" as used herein refers to a difunctional branched or unbranched saturated hydrocarbon group, typically containing 1 to 20 carbon atoms.

The term "inert" to refer to a substituent or compound means that the substituent or compound will not undergo modification either (1) in the presence of reagents that will likely contact the substituent or compound, or (2) under conditions that the substituent or compound will likely be subjected to (e.g., chemical processing carried out subsequent to attachment an "inert" moiety to a substrate surface).

The term "available" to refer to an optionally substituted carbon atom refers to a carbon atom that is covalently bound to one or more hydrogen atoms that can be replaced by a designated substituent without disrupting or destabilizing the remaining structure of the molecule. "Optional" or "optionally" means that the subsequently described circumstance may or may not occur, so that the description includes instances where the circumstance occurs and instances where it does not. For example, the phrase "optionally substituted" means that a non-hydrogen substituent may or may not be present, and, thus, the description includes structures wherein a non-hydrogen substituent is present and structures wherein a non-hydrogen substituent is not present.

THE SURFACE "PATTERNING" METHOD:

In a first embodiment, the invention is directed to a method for providing a pattern on a substrate surface, and is generically applicable regardless of substrate material, the nature of the surface, or the reagents used, so long as the substrate has a surface to which molecular moieties can covalently bind. The method generally involves identifying predetermined regions on the substrate surface that correspond to a desired surface pattern, covalently attaching an inert molecular moiety to the surface within those predetermined regions, covalently attaching a second molecular moiety to the remaining regions of the surface, wherein the second molecular moiety, after binding to the surface, has a functional group at its "free" terminus enabling further reaction, and, finally, synthesizing polymers on the surface using the aforementioned "free" functional groups.

That is, following identification of the "predetermined regions" which define a desired surface pattern, the substrate surface is derivatized by contacting the predetermined regions of the surface with a molecular moiety A-B, wherein A is a reactive terminus and B is an inert segment, under conditions effective to bring about covalent binding of the molecular moiety A-B to the surface through the reactive terminus A, thus providing surface-bound B segments in the predetermined regions with the remainder of the surface comprised of unmodified regions. The derivatized surface so provided is then contacted with a molecular moiety A'-L-C, wherein A' is a reactive terminus and may or may not be the same as A, L is a linker, and C is a molecular segment terminating in a functional group, under conditions effective to bring about covalent binding of the molecular moiety A'-L-C to the unmodified regions of the substrate surface through the reactive terminus A', whereby a modified substrate surface is provided having surface-bound B segments in the predetermined regions and surface-bound C segments on the remainder of the surface. Thus, at this point, a modified surface is provided having surface-bound inert segments "-B" in the predetermined regions and surface-bound functionalizable segments "-L-C" in the remaining regions. In the final step of the process, this modified surface is contacted with a polymerizable composition under conditions effective to result in the binding of a polymer to the exposed functional groups of the surface-bound -L-C segments.

The surface of the substrate may be comprised of the substrate material itself, i.e., representing simply the exterior of a monolithic solid, or the surface may be in the nature of a thin film or coating deposited upon a substrate. The substrate surface may be formed of a conductive, nonconductive, semiconducting material, or the like, and may comprise, for example, glass, silica, alumina, plastic or other organic polymers, for example, acrylonitrile-butadiene-styrene copolymers, polysulfone, polystyrene, metals, bioerodable materials such as poly(glycolic acid), polyanhydrides, polyorthoesters, polylactic acid, or combinations thereof The substrate may include a bonding layer such as a thin titanium film, to promote adhesion between the substrate and a surface coating.

In a preferred embodiment, the initial step of the process is conducted using a microcontact printing method to transfer the molecular moiety A-B is from a stamp to the substrate surface, wherein the surface-bound B segments so provided comprise a self-assembled monolayer, i.e., the B segments are selected so that a self-assembled monolayer spontaneously forms following transfer to the substrate surface. As is known in the art, and as explained, for example, in U.S. Pat. Nos. 5,512,131 to Kumar et al. and U.S. Pat. No. 5,776,748 to Singhvi et al., and in Delamarche et al. (1996)and Xia et al. (1998), cited supra, microcontact printing is a soft lithography technique in which a stamp coated with a molecular moiety "stamps" a substrate surface and transfers the moiety thereto. The stamp has a patterned stamping surface and a corresponding or inverse pattern comprised of relief structures, whereby the molecular moiety is then transferred to a substrate surface upon "stamping" so that the pattern of the stamping surface is maintained.

The stamp is preferably comprised of an elastic material so as to allow conformation of the stamping surface to irregularities present in the substrate surface and allow transfer to substrate surfaces which may be nonplanar. However, the stamp material should be sufficiently rigid to maintain definition and clarity when transferring a molecular moiety, via stamping, to a substrate surface. The stamp material should also be such that the molecular moiety to be transferred is absorbed by the stamping surface. Finally, the stamp should be substantially free of any leachable materials or additives that could interfere with, react with, or contaminate the molecular moiety to be transferred. Preferred stamp materials are elastomeric polymers that include, but are not limited to polysiloxanes such as polydimethylsiloxane (e.g., those sold under the tradename Sylgard® by Dow Chemical, Midland, Mich.) and the like.

The molecular moiety A-B is selected so that it can bind, through the reactive terminus A, to a substrate surface, and so that the surface-bound B moieties will spontaneously form a self-assembled monolayer. By reactive "terminus" as used to refer to segment "A" of the molecular moiety is meant either the physical end of a molecule or a portion of a molecule available for forming a bond with the substrate surface. Clearly, the "A" segments of the molecular moiety are selected in concert with the material of the substrate surface; that is, the chemical nature of the substrate surface dictates functional groups that will enable covalent binding of a molecular moiety thereto. As explained in U.S. Pat. No. 5,512,131 to Kumar et al., any material may be used for the substrate surface so long as the material is solid at room temperature, including electrically conductive, electrically nonconductive and electrically semi-conductive materials, with the proviso that there be some functional group that enables covalent binding of a molecular moiety to the substrate surface. Preferred substrate surface materials and corresponding functional groups include, for example, gold, silver, copper, cadmium, zinc, palladium, platinum, mercury, lead, iron, chromium, manganese, tungsten, and any alloys thereof with sulfur-containing functional groups such as thiols, sulfides, disulfides (e.g., —SR or —SSR where R is alkyl, typically lower alkyl, or aryl), and the like; doped or undoped silicon with silanes and chlorosilanes (e.g., —SiR$_2$Cl wherein R is alkyl, typically lower alkyl, or aryl); metal oxides such as silica, alumina, quartz, glass, and the like with carboxylic acids; platinum and palladium with nitrites and isonitriles; and copper with hydroxamic acids. Additional suitable functional groups suitable as the reactive terminus "A" include acid chlorides, anhydrides, epoxides, sulfonyl groups, phosphoryl groups, hydroxyl groups, amino acid groups, amides, and the like, while additional substrate surface materials include polymeric materials, germanium, gallium, arsenic, and gallium arsenide.

The moiety B, as noted above, is such that surface-bound B groups spontaneously form self-assembled monolayers after transfer to the substrate surface, providing surface-bound B groups that are nonreactive with respect to etching reagents, plating reagents, and the like. Generally, the molecular moiety A-B is A—(CH$_2$)$_n$—H but other moieties such as those containing unsaturated bonds, nonhydrocarbyl linkages (e.g., —O—. —S—, and the like) can be used so long as a self-assembled monolayer of inert molecular segments is provided upon transfer to the substrate surface. The subscript "n" is an integer generally in the range of 1 to 20, preferably in the range of 1 to 15, and most preferably in the range of 4 to 15.

Transfer of the molecular moiety A-B from a stamp to a substrate surface is illustrated generally in Step A of FIG. 1, wherein the stamp is shown generally at 10, having a patterned stamping surface 12 and corresponding relief structures 14, with the molecular moiety A-B shown as a coating 16 over the entirety of the stamp surface. Stamp 10 is brought into contact with the surface 18 of substrate 20 in order to transfer the molecular moiety from the patterned stamping surface 12 to substrate surface 18. The pattern 22 of resultant self-assembled monolayers, i.e., the pattern of surface-bound "B" segments on substrate surface 18, is thus identical to the pattern of the stamping surface 12. The derivatized surface so provided is shown generally, in FIG. 1, at 24.

Following transfer of the molecular moiety A-B to substrate surface 18 to form pattern 22, the unmodified regions 26 of the derivatized substrate surface 24 are then derivatized as well. In this next step of the process, the derivatized substrate surface 24 provided in the aforementioned step is contacted with a molecular moiety A'-L-C, wherein A' is a reactive terminus and may or may not be the same as A, L is a linker, and C is a molecular segment terminating in a functional group, under conditions effective to bring about covalent binding of the molecular moiety A'-L-C to the unmodified regions of the substrate surface through the reactive terminus A'. Generally this process involves simply applying to the derivatized substrate surface a solution of A'-L-C in a suitable solvent, followed by solvent removal using conventional means.

As the reactive terminus A' serves the same purpose as reactive terminus A, it may or may not be identical thereto. Suitable A' groups thus include, without limitation, thiols, sulfides, disulfides, sulphonic acids, silanes, chlorosilanes, carboxylic acids, carboxylate salts, phosphonic acids, nitriles, isonitriles, amines, amine salts, amides, anhydrides, epoxides, hydroxamic acids, hydroxyl groups, and the like, and are preferably selected to correspond to the material of the substrate surface so as to enable covalent binding thereto. The linker L serves to provide physical spacing between the molecular segment C and the substrate surface, and can comprise any linking moiety that does not disrupt formation or packing of self-assembled monolayers comprised of surface-bound -L-C segments. The linker may be polar, nonpolar, positively charged, negatively charged or uncharged, and may be, for example, saturated or unsaturated, linear or branched alkylene, aralkylene, alkarylene, or other hydrocarbylene, such as halogenated hydrocarbylene, particularly fluorinated hydrocarbylene. Preferred linkers are simply saturated alkylene of 3 to 20 carbon atoms, i.e., —(CH$_2$)$_4$— wherein n is an integer in the range of 3 to 20 inclusive. Most preferably, the length of the linker is selected to provide surface-bound -L-C segments having in the range of about 8 to about 12 carbon atoms. The molecular segment C is or includes a functional group which extends from the substrate surface after binding of the -L-C groups thereto, and allows for further reaction. In particular, C comprises a functional group that enables attachment of a polymer thereto or that provides an initiation site for polymerization. Preferred C moieties comprise functional groups such as hydroxyl groups, thiol groups, carboxyl groups, epoxide groups, anhydrides, amino groups, alkoxyamine groups, halide substituents, sulfonyl halide groups, acid halide substituents, particularly acid chloride substituents, and the like, with particularly preferred C moieties comprising reactive hydroxyl groups. As with the surface-bound -B segments, the surface-bound -L-C segments spontaneously form into a self-assembled monolayer. Thus, this step results in a substrate surface that is completely covered with a first self-assembled monolayer comprised of surface-bound -B segments, present in a predetermined surface pattern, and, contiguous therewith, a second self-assembled monolayer comprised of surface-bound -L-C segments on which a polymeric layer will be provided.

This part of the present process is illustrated in Step B of FIG. 1, where the unmodified regions 26 of derivatized substrate surface 24 are filled in with surface-bound -L-C segments that form a second self-assembled monolayer 28 having exposed functional groups 30 available for further reaction.

In the final step of the process, illustrated in Step C of FIG. 1, the exposed functional groups 30 of the second self-assembled monolayer 28 of modified substrate surface 32 are used to attach a polymer or to serve as the initiation sites for polymerization, whereby a pattern 34 of brush polymer regions 36 is provided. That is, the modified substrate surface 32 is contacted with a polymerizable composition under conditions effective to result in the covalent attachment of a polymer to the functional groups 30. Preferably, the polymerizable composition is comprised of reactive monomers that will sequentially form polymers at initiation sites comprised of the exposed functional groups 30. The specific monomers and the resultant polymer are not critical, nor is the mode by which polymerization takes place. Rather, it is desired simply that the polymer film formed provide a sufficient barrier to provide protection of the underlying substrate surface with respect to etching reagents, plating reagents, and the like. It has now been found, surprisingly, that a polymer film overlying the self-assembled monolayer and covalently bound thereto masks defects in the SAM and incomplete surface coverage that can result during SAM formation. In this way, the resistance of the covered surface to a wide range of etchants is significantly improved, and high-resolution surface patterning is enabled as "lateral" movement of individual molecular segments within the underlying monolayer is minimized.

Any technique may be used to provide the surface-bound brush polymers, so long as the polymers are covalently bound to the terminal functional groups of the second self-assembled monolayer. One preferred technique involves derivatization of the exposed functional group with a living free radical polymerization initiator followed by living free radical polymerization of substituted or unsubstituted vinyl monomers. A variation to this technique may also be used, wherein living free radical polymerization of substituted or unsubstituted vinyl polymers using, as a starting point, an alkoxyamine or α-halo ester functional group contained within the surface-bound "C" segment in the presence of a polymerization initiator. Suitable living free radical polymerization initiators for use in the aforementioned polymerization methods have the structural formula

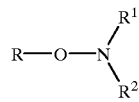

in which the free radical R• is capable of end capping the polymerization of vinyl monomers, and $R^1$ and $R^2$ are each independently alkyl or aryl, including substituted and unsubstituted alkyl and aryl, wherein the substituents are, for example, cyano, carboxyl, and the like, or $R^1$ and $R^2$ together form an optionally alkyl-substituted cycloalkyl ring containing 4 to 7, typically 5 or 6, carbon atoms. Suitable R groups are alkyl, alkenyl, aryl, and aryl-substituted alkyl, although preferred R groups comprise halogenated aryl moieties. Examples of specific R groups include phenyl, substituted phenyl (particularly halogenated phenyl such as p-bromophenyl and p-chlorophenyl), benzyl, substituted benzyl (particularly halogenated benzyl and alpha-methyl benzyl), lower alkenyl, particularly allyl, and cyanoisopropyl. Specific examples of such living free radical polymerization initiators are derivatives of 2,2,6,6-tetramethyl-1-piperidinyloxy ("TEMPO"), having the structural formula

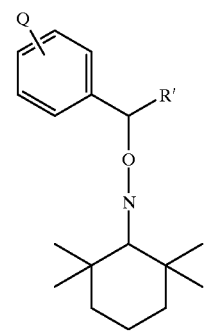

wherein $R^1$ is as defined above, and Q is halogen, preferably chloro or bromo. The "TEMPO" moiety itself has the structural formula

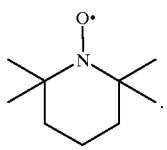

Another preferred polymerization technique involves surface-initiated ring-opening polymerization ("ROP") of cyclic esters such as lactones, lactides, and the like, in the presence of a suitable promoter, typically an organometallic promoter such as an aluminum alkoxide. For example, C may comprise a di(ethylene glycol) group that can serve as a polymerization initiating moiety for the ring-opening polymerization of ε-caprolactone.

The thickness of the polymer coating and polydispersity of the covalently attached polymer changes can be readily controlled, e.g., by the use of an added initiator, by controlling polymerization time and temperature, and the like.

Still other preferred polymerization techniques involve controlled procedures that are initiated from well-defined initiating "C" groups that are bound to the substrate surface. These polymerization techniques include, but are not limited to, cationic procedures, metathesis ("ROMP") polymerizations, and the like. Alternatively, the functional group "C" may be involved in condensation polymerizations, in which case "C" undergoes reaction with monomers, oligomers and polymers in the polymerization step.

Polymerization will generally be conducted under bulk conditions, or possibly in a solvent. Suitable solvents are those in which the components of the polymerization composition substantially dissolve and which has a viscosity convenient for coating, as in the manufacture of integrated circuits and the like. The solution will generally comprise from about 5 to 80, preferably 10 to 70, weight percent solids.

In an alternative embodiment of the invention, the process as described above is carried out without first depositing molecular moiety A-B, i.e., without first forming a self-assembled monolayer of inert molecular segments. That is, predetermined regions of a substrate surface are identified as corresponding to a particular pattern, the regions are derivatized with the molecular moiety A'-L-C as defined above, and polymerization is then conducted to provide a polymeric film covalently bound to the surface-bound -L-C segments, thus providing polymer "brush" coverage of the predetermined surface regions. This is particularly advantageous in a process for etching an electrically conductive substrate, as done in the fabrication of microelectronic devices such as microelectronic resistors, transistors, capacitors, circuit breakers and the like. In this embodiment, the substrate surface is electrically conductive, and following surface-initiated polymerization, the exposed regions of the conductive surface are etched with a chemical etchant. This method represents a significant improvement over analogous methods wherein coverage is provided with only an SAM (as described, for example, in U.S. Pat. No. 5,512,131 to Kumar et al.), insofar as a wider range of etchants may be used with the present process and the surface coverage resulting from a polymer film overlying the SAM is more complete and precise than an "uncovered" SAM.

Figure 2:
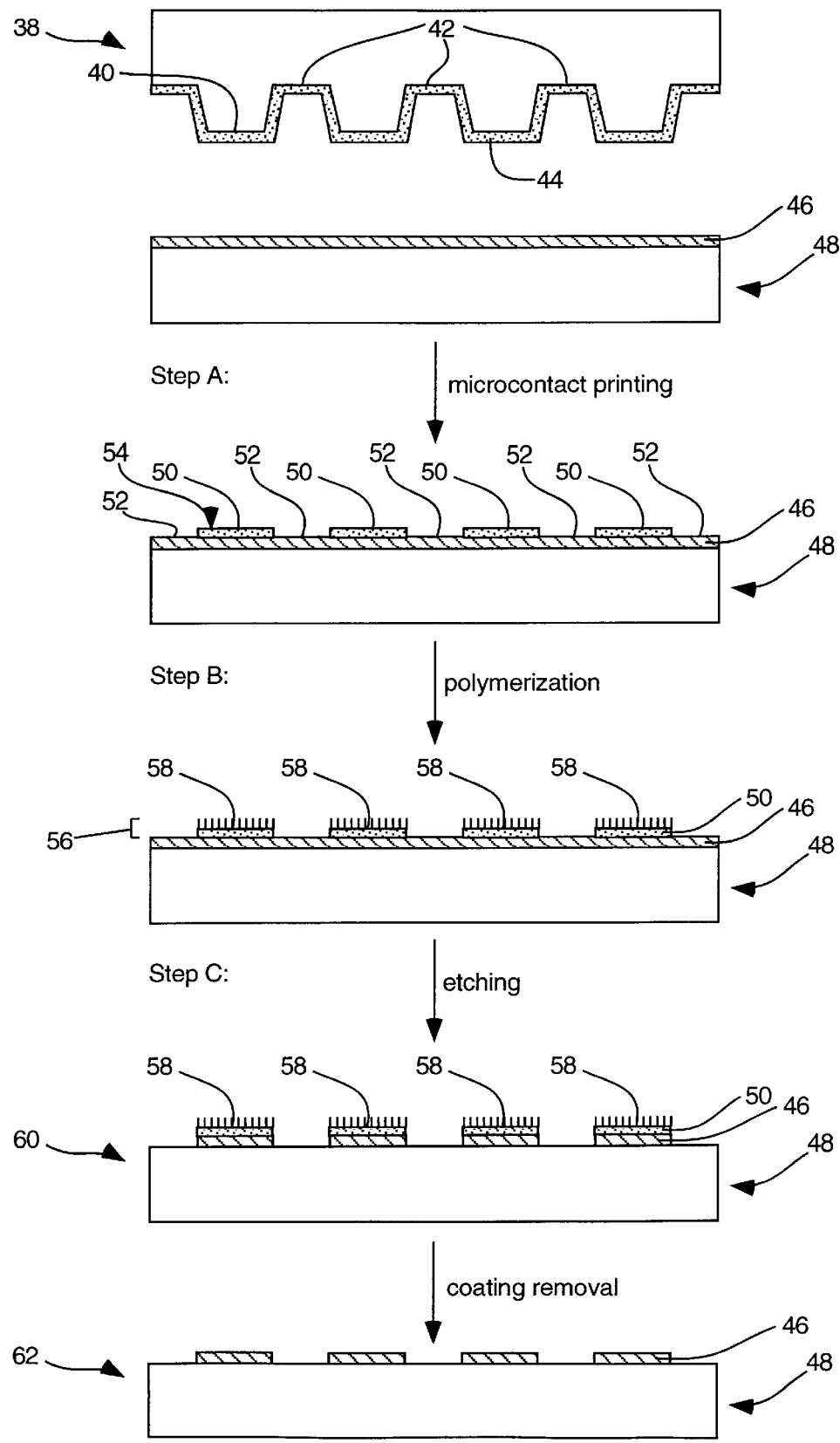
FIG. 2 illustrates an alternative embodiment of the invention, wherein a brush polymer pattern is used to provide etch resistance during etching of a conductive substrate surface.

The aforementioned process is illustrated in FIG. 2, wherein stamp 38 having a patterned stamping surface 40 and corresponding relief structures 42 is coated with the molecular moiety A'-L-C; the coating is shown at 44. In a microcontact printing process, i.e., in Step A of FIG. 2, stamp 38 is brought into contact with the surface 46 of substrate 48 in order to transfer the molecular moiety A'-L-C thereto. The pattern 50 of the resultant self-assembled monolayer is thus identical to the pattern of the stamping surface 40; the remaining regions 52 of the conductive surface remain uncovered. In the next step, illustrated as Step B in FIG. 2, the exposed functional groups 54 of the self-assembled monolayer are used to attach a polymer or to serve as the initiation site for polymerization, whereby a pattern 56 of brush polymer regions 58 is provided. As illustrated in Step C of FIG. 2, the modified surface so prepared is then contacted with an etchant so as to etch away those portions of the conductive substrate surface that are not covered with the polymer-coated SAM layer, resulting in etched substrate 60. Finally, the organic material is removed from the substrate surface, giving rise to the final product 62.

The present process is also useful in the fabrication of biosensors, high-density assay plates, and the like. Methods for implementation of the presently disclosed and claimed methods in such areas will be readily apparent to those skilled in the art, based upon the present disclosure as well as the pertinent texts, literature references and patents, e.g., U.S. Pat. No. 5,512,131 to Kumar et al., cited earlier herein.

For example, biosensors may be fabricated by providing a patterned SAM functionalized with an overlying polymeric brush covalently bound thereto, wherein the "free" termini of the brush polymers have exposed functionalities that are useful in detecting a particular species in a medium. For example, the brush polymers may be provided with an exposed functionality including an antigen, antibody, or any of a variety of specific or non-specific binding pairs. Accordingly, the surface-modified substrate may serve a function analogous to that of a microparticle or titer plate which has been prepared for a test assay such as an immunoassay, if a According to another embodiment in which a biosensor is provided, the exposed termini of the surface-bound brush polymers may be provided with a functionality defining a binding partner of a particular analyte. In a competitive assay, for example, a known quantity of labeled analyte may be provided in a medium along with an unknown quantity of analyte, and the medium exposed to the derivatized substrate surface. Alternately, in an assay analogous to a sandwich assay, a medium containing an unknown quantity of analyte and an excess of a second binding partner that would bind to the analyte when it binds to functionalities in the brush polymer regions may be provided. According to either method, after exposure to the test medium, analysis may be carried out according to a variety of methods. Additionally, a bioassay may be provided according to the present invention by providing a SAM-bound brush polymer pattern on a surface, portions of the surface remaining exposed. Then, the exposed portions of the surface may be contacted with a species selected to react chemically with the material, and the material may be contacted with the species for a predetermined period of time to etch physical wells in the material surface of a predetermined depth. Then, the organic material may be removed from the substrate surface, revealing the welled surface. A plurality of wells in a surface having very small dimension and spaced in very close proximity may be created. This may serve as a very high-density assay plate, for example, an ELISA assay plate.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

All patents, patent applications, and publications mentioned herein are hereby incorporated by reference in their entireties.

Experiment:

The following example is put forth so as to provide those of ordinary skill in the art with a complete disclosure and description of how to carry out the method of the invention. Efforts have been made to ensure accuracy with respect to numbers (e.g., quantities, temperature, etc.) but some errors and deviations should be accounted for. Unless indicated otherwise, parts are parts by weight, temperature is in ° C. and pressure is at or near atmospheric. Additionally, all starting materials were obtained commercially or synthesized using known procedures.

EXAMPLE

This example describes the preparation of patterned polymer brushes from microcontact printed gold surfaces, using surface-initiated polymerization to chemically amplify a patterned self-assembled monolayer into a macromolecular film.

Materials and Substrates. Gold films (200 nm) were deposited by electron beam evaporation on glass slides that had been primed with titanium (10–25 nm) to promote adhesion between the glass and gold. The elastomeric stamp was formed by pouring a mixture of poly(dimethylsiloxane) (PDMS) prepolymer and its curing agent, Sylgard® 184CA, (10:1 by weight) onto a clean polystyrene Petri dish. The dish was left at 60° C. for at least 12 h to ensure a complete cure of the polymer mixture. After removal of the master, the elastomeric stamp was rinsed three times with ethanol and dried under a flow of $N_2$ for 30 s. Thiol derivatives were prepared according to Kumar et al (1992) *J. Am. Chem. Soc.* 114:9188.

Microcontact Printing. A solution of 3 mM of hexadecylthiol in ethanol was used as the ink. The stamp was inked by brushing its surface with a cotton swab soaked in the inking solution. The excess solvent was evaporated from the stamp by placement of the stamp under a stream of $N_2$ (30s). The stamp was placed by hand onto a polycrystalline gold substrate and withdrawn after a contact period of 5 s. The stamped gold substrate was washed with ethanol, dried under a flow of $N_2$ for 30 s and immersed into a 1 mM solution of $HO(CH_2CH_2O)_2(CH_2)_{11}SH$ in ethanol for 30 min. The slides were then washed with ethanol and dried under a flow of $N_2$.

Polymerization. Diethylaluminum alkoxide, used as a promoter for the ring-opening polymerization process, was prepared in a glove box purged with argon. To a solution of benzyl alcohol (103 μl, 1.0 mmol) in dry toluene (15 ml) was added dropwise triethylaluminum (0.55 ml of a 2.0 M solution, 1.1 eq., 1.1 mmol). This solution was vigorously stirred at room temperature for 30 min. Gold films supporting either SAMs formed from $HO(CH_2CH_2O)_2(CH_2)_{11}SH$ or patterned SAMs of both $HO(CH_2CH_2O)_2(CH_2)_{11}SH$ and hexadecylthiol were then placed into the solution and allowed to stand for 1 h before the toluene was removed under vacuum. Dry toluene (75 ml) was then added followed by E-caprolactone (11.1 ml, 100 mmol) and the polymerization mixture stirred at room temperature for 3 h. To the viscous solution was added acetic acid (5 ml). After stirring for 5 min, the gold wafers were removed and washed repeatedly with dichloromethane, toluene, THF and ethanol. To measure the molecular weight and polydispersity of the polymer grown in solution, the supernatant from the polymerization mixture was precipitated into methanol (500 ml), collected by precipitation and dried. The polydispersity of these materials, determined by GPC, was typically between 1.2 and 1.4 and the molecular weights, also determined by GPC, were within 10% of the theoretical value.

Figure 3:
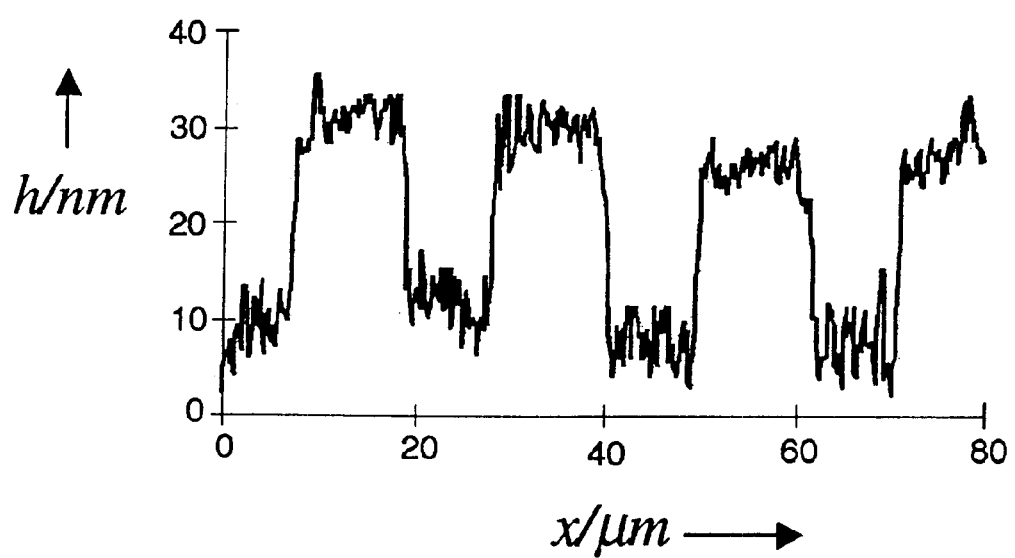
FIG. 3 is a graph illustrating chemical amplification of patterned SAMs with spatially localized polymer brushes evaluated using atomic force microscopy, as explained in the Example.

Chemical amplification of the patterned hydroxyl functionalized SAM into spatially localized polymer brushes was confirmed by high resolution atomic force microscopy ("AFM"), which also revealed an internal structure within the polymer films that reflect the semicrystalline nature of the poly(caprolactone) brushes. FIG. 3 is a graph derived from the AFM image, in which the Y-axis represents the vertical height of the polymer brush sections, in nanometers, and the X-axis represents the scan length, in micrometers, across the substrate surface. As may be seen, the brush areas are well defined, and substantially uniform in height. No extraneous or unwanted polymer is seen in areas that were not stamped with an initiation site.

What is claimed is:

1. A method for preparing a substrate having a patterned surface, comprising:

(a) providing a substrate having a surface to which molecular moieties can covalently bind;

(b) identifying regions on the substrate surface that correspond to a desired surface pattern;

(c) derivatizing the identified regions on the substrate surface by contacting the identified regions with a molecular moiety A-B, wherein A is a reactive terminus and B is an inert segment, under conditions effective to bring about covalent binding of the molecular moiety A-B to the surface through the reactive terminus A, thus providing surface-bound B segments in the identified regions with the remainder of the surface comprised of unmodified regions;

(d) contacting the derivatized substrate surface provided in (c) with a molecular moiety A'-L-C, wherein A' is a reactive terminus and may or may not be the same as A, L is a linker, and C is a molecular segment terminating in a functional group, under conditions effective to bring about covalent binding of the molecular moiety A'-L-C to the unmodified regions of the substrate surface through the reactive terminus A', whereby a modified substrate surface is provided having surface-bound B segments in the derivatized regions and surface-bound C segments on the remainder of the surface; and (e) contacting the modified surface provided in (d) with a polymerizable composition of monomers under conditions effective to result in polymerization of the monomers at an initiation site composed of the functional group of the surface-bound C segment, wherein the polymerization is selected from the group consisting of living free radical polymerization, ring-opening polymerization, metathesis polymerization, and cationic polymerization and results in the binding of a polymer to the functional groups of the surface-bound C segments.

2. The method of claim 1, wherein the substrate is metallic.

3. The method of claim 1, wherein the substrate is comprised of a metal oxide.

4. The method of claim 1, wherein the substrate is silicon-containing.

5. The method of claim 1, wherein the substrate is polymeric.

6. The method of claim 1, wherein (b) is conducted by stamping the substrate surface with a stamp coated with the molecular moiety A-B in a pattern that is identical to the pattern defined by the identified regions on the substrate surface.

7. The method of claim 1, wherein the surface-bound B segments provided in (c) comprise a self-assembled monolayer.

8. The method of claim 1, wherein the surface-bound -L-C segments provided in (d) comprise a self-assembled monolayer.

9. The method of claim 1, wherein A is selected from the group consisting of —OH, —SH, —NH$_2$, —CONH$_2$, —COOH, —SO$_3$H, —CN, —PO$_3$H, —SiCl$_3$, —SiR$_2$Cl, —SR and —SSR wherein R is alkyl or aryl.

10. The method of claim 1, wherein A' is selected from the group consisting of —OH, —SH, —NH$_2$, —CONH$_2$, —COOH, —SO$_3$H, —CN —OH, —SH, —NH$_2$, —PO$_3$H, —SiCl$_3$, —SiR$_2$Cl, —SR and —SSR wherein R is alkyl or aryl.

11. The method of claim 1, wherein B is hydrocarbyl of 1 to 20 carbon atoms containing 0 to 6 ether linkages.

12. The method of claim 11, wherein B is saturated alkyl containing 1 to 15 carbon atoms and 0 to 4 ether linkages.

13. The method of claim 1, wherein L is hydrocarbylene of 1 to 20 carbon atoms containing 0 to 6 ether linkages.

14. The method of claim 13, wherein L is saturated alkylene containing 1 to 15 carbon atoms and 0 to 4 ether linkages.

15. The method of claim 1, wherein C is selected from the group consisting of —OH, —NH$_2$, —COOH, —SO$_3$H, —CN, alkoxyamine, azo, peroxide, halide and sulfonyl halide.

16. The method of claim 1, wherein the monomers in (e) are vinyl monomers, the composition of monomers further comprises a living free radical polymerization initiator, and the polymerization is living free radical polymerization.

17. The method of claim 1, wherein the monomers in (e) are cyclic esters, the composition of monomers further comprises an organometallic promoter, and the polymerization is ring-opening polymerization.

18. The method of claim 1, wherein the polymerization in (e) is metathesis polymerization.

19. The method of claim 1, wherein the polymerization in (e) is cationic polymerization.

20. A method for etching a substrate surface, comprising:

(a) identifying regions on the surface to be protected from etching;

(b) contacting the identified regions with a molecular moiety A'-L-C, wherein A' is a reactive terminus, L is a linker, and C is a molecular segment terminating in a functional group, under conditions effective to bring about covalent binding of the molecular moiety A'-L-C to the surface through the reactive terminus A', thus providing surface-bound -L-C segments in the identified regions with the remainder of the surface comprised of unmodified, exposed regions; and (c) contacting the surface derivatized in (b) with a polymerizable composition of monomers under conditions effective to result in polymerization of the monomers at an initiation site composed of the functional group of the surface-bound C segment, wherein the polymerization is selected from the group consisting of living free radical polymerization, ring-opening polymerization, metathesis polymerization, and cationic polymerization and results in the binding of a polymer to the functional groups of the surface-bound C segments; and (d) contacting the surface modified in (c) with a reagent that is selected to degrade the unmodified, exposed regions of the surface but that is inert with respect to the surface-bound polymer.

21. The method of claim 20, further including, after (d), removing the surface-bound -L-C groups and the polymer to uncover the identified regions of the surface.

22. The method of claim 20, wherein the surface-bound -L-C segments provided in (c) comprise a self-assembled monolayer.

23. The method of claim 20, wherein the surface is electrically conductive.

24. The method of claim 20, wherein the monomers in (c) are vinyl monomers, the composition of monomers further comprises a living free radical polymerization initiator, and the polymerization is living free radical polymerization.

25. The method of claim 20, wherein the monomers in (c) are cyclic esters, the composition of monomers further comprises an organometallic promoter, and the polymerization is ring-opening polymerization.

26. The method of claim 20, wherein the polymerization in (c) is metathesis polymerization.

27. The method of claim 20, wherein the polymerization in (c) is cationic polymerization.

* * * * *

UNITED STATES PATENT AND TRADEMARK OFFICE
CERTIFICATE OF CORRECTION

PATENT NO.    : 6,413,587 B1
DATED         : July 2, 2002
INVENTOR(S)   : Craig John Hawker et al.

It is certified that error appears in the above-identified patent and that said Letters Patent is hereby corrected as shown below:

<u>Title page,</u>
Item [73], please add the following Assignee information to the present one that is listed: -- The Regents of the University of California, Oakland, California. --

Signed and Sealed this

Twenty-second Day of April, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,413,587 B1                                          Page 1 of 1
DATED         : July 2, 2002
INVENTOR(S)   : Craig Jon Hawker et al.

It is certified that error appears in the above-identified patent and that said Letters Patent is hereby corrected as shown below:

<u>Column 1,</u>
After the title and before the section entitled "TECHNICAL FIELD," please insert the following section:
-- REFERENCE TO GOVERNMENT SUPPORT This invention was partially sponsored by the National Science Foundation under Grant No. DMR-9400354. --

Signed and Sealed this

Second Day of March, 2004

JON W. DUDAS
*Acting Director of the United States Patent and Trademark Office*